(12) United States Patent
Chang et al.

(10) Patent No.: US 12,216,332 B2
(45) Date of Patent: Feb. 4, 2025

(54) IMAGING LENS ASSEMBLY AND ELECTRONIC DEVICE

(71) Applicant: LARGAN PRECISION CO., LTD., Taichung (TW)

(72) Inventors: Chien-Pang Chang, Taichung (TW); Wen-Yu Tsai, Taichung (TW); Lin-An Chang, Taichung (TW); Ming-Ta Chou, Taichung (TW); Kuo-Chiang Chu, Taichung (TW)

(73) Assignee: LARGAN PRECISION CO., LTD., Taichung (TW)

( * ) Notice: Subject to any disclaimer, the term of this patent is extended or adjusted under 35 U.S.C. 154(b) by 540 days.

(21) Appl. No.: 17/545,001

(22) Filed: Dec. 8, 2021

(65) Prior Publication Data

US 2022/0196969 A1 Jun. 23, 2022

Related U.S. Application Data

(60) Provisional application No. 63/129,833, filed on Dec. 23, 2020.

(51) Int. Cl.
| | |
|---|---|
| *G02B 9/04* | (2006.01) |
| *C23C 16/40* | (2006.01) |
| *G02B 1/04* | (2006.01) |
| *G02B 1/11* | (2015.01) |
| *G02B 3/04* | (2006.01) |

(52) U.S. Cl.
CPC ............... *G02B 9/04* (2013.01); *C23C 16/40* (2013.01); *G02B 1/041* (2013.01); *G02B 1/11* (2013.01); *G02B 3/04* (2013.01)

(58) Field of Classification Search
None
See application file for complete search history.

(56) References Cited

U.S. PATENT DOCUMENTS

| | | | |
|---|---|---|---|
| 6,104,534 | A | 8/2000 | Ohta et al. |
| 6,175,450 | B1 | 1/2001 | Andreani et al. |
| 6,493,144 | B2 | 12/2002 | Tanaka et al. |
| 6,972,136 | B2 | 12/2005 | Koenig et al. |
| 7,301,695 | B2 | 11/2007 | Otani et al. |
| 8,125,714 | B2 | 2/2012 | Yamada et al. |
| 8,840,257 | B2 | 9/2014 | Kawagishi et al. |
| 8,908,275 | B2 | 12/2014 | Fukagawa et al. |

(Continued)

FOREIGN PATENT DOCUMENTS

| | | |
|---|---|---|
| CN | 106405692 B | 3/2018 |
| CN | 106104348 B | 10/2018 |

(Continued)

*Primary Examiner* — Marin Pichler
*Assistant Examiner* — Mackenzi Waddell
(74) *Attorney, Agent, or Firm* — McClure, Qualey & Rodack, LLP

(57) ABSTRACT

An imaging lens assembly has an optical axis and includes a plastic lens element set. The plastic lens element set includes two plastic lens elements and at least one anti-reflective layer. The two plastic lens elements, in order from an object side to an image side along the optical axis are a first plastic lens element and a second plastic lens element. The anti-reflective layer has a nanostructure and is disposed on at least one of an image-side surface of the first plastic lens element and an object-side surface of the second plastic lens element.

12 Claims, 13 Drawing Sheets

(56) References Cited

U.S. PATENT DOCUMENTS

| | | | |
|---|---|---|---|
| 8,982,466 B2 | 3/2015 | Neuffer | |
| 9,069,125 B2 | 6/2015 | Hirasawa et al. | |
| 9,158,039 B2 | 10/2015 | Okuno et al. | |
| 9,158,040 B2 | 10/2015 | Kamiyama et al. | |
| 9,164,200 B2 | 10/2015 | Tamura et al. | |
| 9,279,916 B2 | 3/2016 | Murata et al. | |
| 9,285,509 B2 | 3/2016 | Murata et al. | |
| 9,310,528 B2 | 4/2016 | Murata et al. | |
| 9,405,044 B2 | 8/2016 | Okuno | |
| 9,696,464 B2 | 7/2017 | Saeki et al. | |
| 9,709,704 B2 | 7/2017 | Miyahara et al. | |
| 9,817,155 B2 | 11/2017 | Neuffer | |
| 10,139,532 B2 | 11/2018 | Ye et al. | |
| 10,353,117 B2 | 7/2019 | Abe | |
| 10,539,716 B2 | 1/2020 | Schulz et al. | |
| 2009/0067053 A1* | 3/2009 | Momoki | G02B 5/02 359/350 |
| 2016/0377767 A1* | 12/2016 | Sonoda | G02B 1/118 359/614 |
| 2017/0160437 A1 | 6/2017 | Nakayama | |
| 2017/0227735 A1* | 8/2017 | Chou | G02B 7/021 |
| 2019/0041613 A1 | 2/2019 | Jung | |
| 2020/0049928 A1 | 2/2020 | Wei | |
| 2020/0059590 A1* | 2/2020 | Chang | G02B 7/021 |
| 2021/0165136 A1 | 6/2021 | Tsai et al. | |

FOREIGN PATENT DOCUMENTS

| | | | | |
|---|---|---|---|---|
| CN | 109975896 A | 7/2019 | | |
| TW | I707169 B | 10/2020 | | |
| WO | WO-2010024214 A1 * | 3/2010 | ........... | G02B 13/003 |

* cited by examiner

IMAGING LENS ASSEMBLY AND ELECTRONIC DEVICE

RELATED APPLICATIONS

This application claims priority to U.S. Provisional Application Ser. No. 63/129,833, filed Dec. 23, 2020, which is herein incorporated by reference.

BACKGROUND

Technical Field

The present disclosure relates to an imaging lens assembly. More particularly, the present disclosure relates to an imaging lens assembly which includes a plastic lens element set applicable to electronic devices.

Description of Related Art

In recent years, portable electronic devices, such as intelligent electronic devices, tablets, etc., are developed rapidly and have been filled with the lives of modern people. Accordingly, an image lens assembly disposed on the portable electronic device is also flourished. However, as technology is more and more advanced, demands for the quality of the image lens assembly from users have become higher and higher. Therefore, developing the image lens assembly with improved movable resolution power becomes a solving problem in industry.

SUMMARY

According to one aspect of the present disclosure, an imaging lens assembly has an optical axis and includes a plastic lens element set. The plastic lens element set includes two plastic lens elements and at least one anti-reflective layer. The two plastic lens elements, in order from an object side to an image side along the optical axis are a first plastic lens element and a second plastic lens element. The anti-reflective layer has a nanostructure and is disposed on at least one of an image-side surface of the first plastic lens element and an object-side surface of the second plastic lens element. When a central distance between a paraxial region of the image-side surface of the first plastic lens element and a paraxial region of the object-side surface of the second plastic lens element is d, a minimum air gap between an off-axis region of the image-side surface of the first plastic lens element and an off-axis region of the object-side surface of the second plastic lens element is AG1, the minimum air gap is formed on the at least one anti-reflective layer, and a grain height of the nanostructure is gH, the following conditions are satisfied: 65 nm<gH<600 nm; and 0.001≤AG1/d<0.7.

According to one aspect of the present disclosure, an electronic device includes the imaging lens assembly and an image sensor. The image sensor is corresponding to the imaging lens assembly.

BRIEF DESCRIPTION OF THE DRAWINGS

The present disclosure can be more fully understood by reading the following detailed description of the embodiment, with reference made to the accompanying drawings as follows.

DETAILED DESCRIPTION

The present disclosure provides an imaging lens assembly, which has an optical axis and includes a plastic lens element set. The plastic lens element set includes two plastic lens elements and at least one anti-reflective layer. The two plastic lens elements in order from an object side to an image side along the optical axis are a first plastic lens element and a second plastic lens element. The anti-reflective layer has a nanostructure and is disposed on at least one of an image-side surface of the first plastic lens element and an object-side surface of the second plastic lens element. When a central distance between a paraxial region of the image-side surface of the first plastic lens element and a paraxial region of the object-side surface of the second plastic lens element is d, a minimum air gap between an off-axis region of the image-side surface of the first plastic lens element and an off-axis region of the object-side surface of the second plastic lens element is AG1, the minimum air gap is formed on the anti-reflective layer, and a grain height of the nanostructure is gH, the following conditions are satisfied: 65 nm<gH<600 nm; and 0.001≤AG1/d<0.7. Via the fact that low reflectivity can be achieved by an air gap formed between the image-side surface of the first plastic lens element and the object-side surface of the second plastic lens element, and the anti-reflective layer having the nanostructure is disposed on at least one of surfaces of the two plastic lens elements, high intensity of reflective light can be largely reduced in the narrowed air gap of the plastic lens element set. In the result, resolving power of the imaging lens assembly won't be limited by the over-high reflectance of surfaces of lens elements so that the allowance of optical design can be improved. Hence, resolving power of the imaging lens assembly can be improved.

The anti-reflective layer can include a metal oxide layer. Specifically, the metal oxide layer can be formed by Atomic Layer Deposition (ALD), Physical Vapor Deposition (PVD), such as evaporative PVD or sputtering PVD. The metal oxide layer can also be formed by Chemical Vapor Deposition (CVD) such as ultrahigh vacuum CVD, microwave plasma-assisted CVD, plasma-enhanced CVD, or atomic layer CVD. The metal oxide layer can be made of aluminum oxide ($Al_2O_3$), but the present disclosure is not limited thereto.

Figure 8:
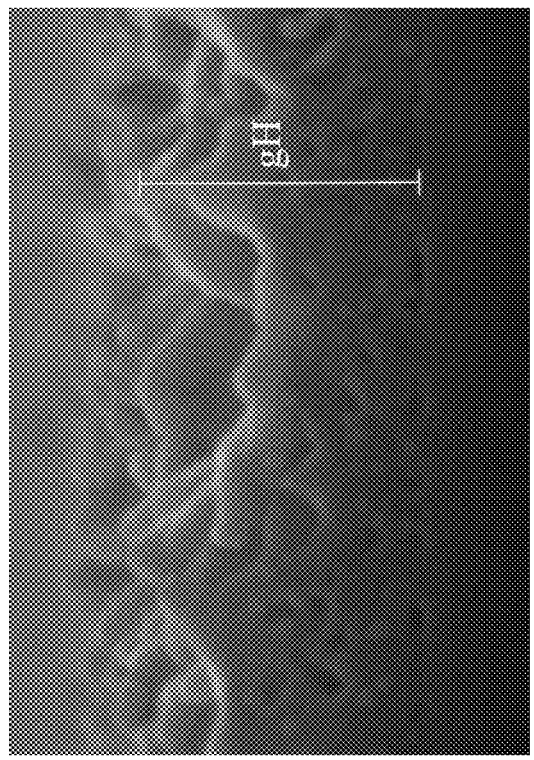
FIG. 8 shows a cross-sectional view of the nanostructure on an edge of an optical effective region of at least one of the image-side surface of the first plastic lens element and the object-side surface of the second plastic lens element according to the present disclosure.
Figure 7:
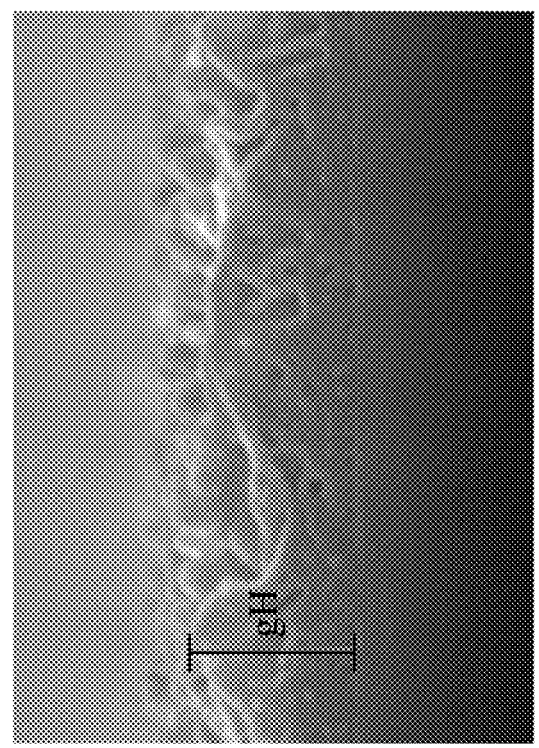
FIG. 7 shows a cross-sectional view of the nanostructure on a center of an optical effective region of at least one of the image-side surface of the first plastic lens element and the object-side surface of the second plastic lens element according to the present disclosure.

The nanostructure of the anti-reflective layer can be called a subwavelength structure. Moreover, the nanostructure can be a grass-like structure which can be observed via Scanning Electronic Microscope (SEM). Furthermore, please refer to FIGS. 7 and 8, wherein FIG. 7 shows a cross-sectional view of the nanostructure on a center of an optical effective region of at least one of the image-side surface of the first plastic lens element and the object-side surface of the second plastic lens element according to the present disclosure, and FIG. 8 shows a cross-sectional view of the nanostructure on an edge of an optical effective region of at least one of the image-side surface of the first plastic lens element and the object-side surface of the second plastic lens element according to the present disclosure. In FIGS. 7 and 8, the nanostructure is a grass-like structure, and a grain height gH of the nanostructure on the center of the optical effective region is 246.6 nm, a grain height gH of the nanostructure on the edge of the optical effective region is 242.6 nm, but the present disclosure is not limited to the structure and the grain heights disclosed in FIGS. 7 and 8.

The minimum air gap between the off-axis region of the image-side surface of the first plastic lens element and the off-axis region of the object-side surface of the second plastic lens element is located between an optical effective region of the image-side surface of the first plastic lens element and an optical effective region of the object-side surface of the second plastic lens element. Via the configuration of the first plastic lens element and the second plastic lens element, the reflective intensity of primary or secondary reflection light can be directly reduced so as to avoid the condition that the light intensity has to be reduced after multiple reflection. Hence, intensity of reflective light in the narrowed air gap can be effectively reduced.

When a peripheral air gap between an edge of the optical effective region of the image-side surface of the first plastic lens element and an edge of the optical effective region of the object-side surface of the second plastic lens element is AG2, and the central distance between the paraxial region of the image-side surface of the first plastic lens element and the paraxial region of the object-side surface of the second plastic lens element is d, the following condition can be satisfied: 0.001<AG2/d<1.8. Hence, uniformity of the thicknesses of the plastic lens elements can be improved. In detail, it can be avoided that the thickness variation from the center to the edge of each of the plastic lens elements changes drastically so as to influence the quality of injection molding of the plastic lens elements. Moreover, when the thickness variation of the plastic lens elements changes too much, the coating quality of the anti-reflective layer on the edge of the plastic lens elements will be influenced. Hence, the failure possibility of coating can be decreased.

The plastic lens element set can be aspherical design so as to effectively regulate the optical quality of a peripheral imaging region. Moreover, the design of inflection point can be provided so as to effectively adjust the condensing quality of light.

When the minimum air gap between the off-axis region of the image-side surface of the first plastic lens element and the off-axis region of the object-side surface of the second plastic lens element is AG1, and the peripheral air gap between the edge of the optical effective region of the image-side surface of the first plastic lens element and the edge of the optical effective region of the object-side surface of the second plastic lens element is AG2, the following condition can be satisfied: 0.01<AG1/AG2<0.9. Via adjusting the location of the minimum air gap, the more reflective light which reflects between the lens elements can be further captured. Hence, the efficiency for blocking reflective light can be improved. Moreover, the following condition can be satisfied: 0.01<AG1/AG2<0.64. When the peripheral air gap is further increased, the specification of optical design can be further improved so as to enlarge the imaging region. Hence, the pixel elements of the imaging lens assembly can be increased.

When the minimum air gap between the off-axis region of the image-side surface of the first plastic lens element and the off-axis region of the object-side surface of the second plastic lens element is AG1, the following condition can be satisfied: 0.001 mm<AG1<0.06 mm. When the minimum air gap further shrinks, the more imaging light can be converged. Hence, the imaging specification of the imaging lens assembly can be improved.

When the grain height of the nanostructure is gH, the following condition can be satisfied: 85 nm<gH<470 nm. Hence, via adequate size of the grain, both of the producing quality of mass production of ultra-low reflective lens elements and the optical requirement of reducing reflective light can be satisfied.

When a reflectance in a wavelength of 400 nm of the anti-reflective layer is R400, a reflectance in a wavelength of 600 nm of the anti-reflective layer is R600, and a reflectance in a wavelength of 700 nm of the anti-reflective layer is R700, the following conditions can be satisfied: 0.0%<R400≤1.0%; 0.0%<R600≤1.0%; and 0.0%<R700≤1.0%. Hence, in the condition that the unnecessary surface reflection in a wavelength region of visible light can be effectively reduced, the extensive capability for removing stray light can be provided. Moreover, the following condition can be satisfied: 0.0%<R700<0.6%. While further attenuating the reflective light in a wavelength region of infrared light, the reflection of infrared light caused by a heating light source during a real shooting can be reduced.

The imaging lens assembly can further include a first light blocking sheet. The first light blocking sheet is disposed between the first plastic lens element and the second plastic lens element, and has an opening. When a diameter of the optical effective region of the image-side surface of the first plastic lens element is ID1, a diameter of the optical effective region of the object-side surface of the second plastic lens element is OD2, and a diameter of the opening of the first light blocking sheet is SD1, the following condition can be satisfied: ID1<SD1<OD2. Via the configuration of the first light blocking sheet, the non-imaging light after reflection can be further blocked. Hence, the light along the redundant reflective path between the two plastic lens elements can be reduced.

The imaging lens assembly can further include a second light blocking sheet. The second light blocking sheet is disposed between the first plastic lens element and the second plastic lens element, and has an opening. When the diameter of the optical effective region of the image-side surface of the first plastic lens element is ID1, the diameter of the optical effective region of the object-side surface of the second plastic lens element is OD2, and a diameter of the opening of the second light blocking sheet is SD2, the following condition can be satisfied: SD2<ID1<OD2. Via the configuration of the second light blocking sheet, the light trap can be formed between the two plastic lens elements. Hence, ghosting images occurring in the dark background can be captured.

Each of the abovementioned features of the imaging lens assembly module can be utilized in various combinations for achieving the corresponding effects.

The present disclosure provides an electronic device. The electronic device includes the aforementioned imaging lens assembly and an image sensor. The image sensor is corresponding to the aforementioned imaging lens assembly.

According to the above description of the present disclosure, the following specific embodiments are provided for further explanation.

1st Embodiment

Figure 1A:
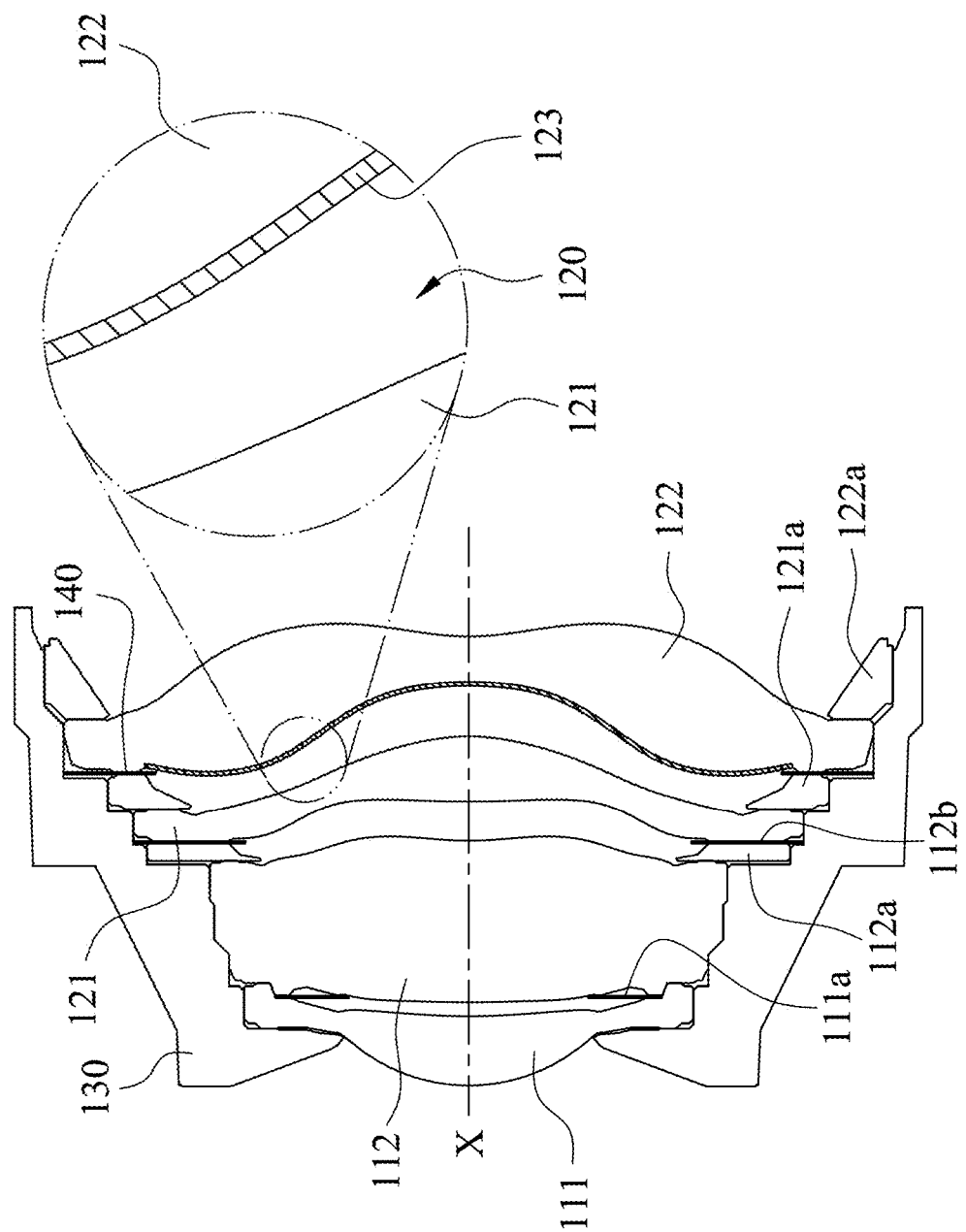
FIG. 1A shows a schematic view of an imaging lens assembly according to the 1st embodiment of the present disclosure.

FIG. 1A shows a schematic view of an imaging lens assembly 100 according to the 1st embodiment of the present disclosure. In FIG. 1A, the imaging lens assembly 100 has an optical axis X and includes a plurality of lens elements 111, 112, a plastic lens element set (its reference is omitted) and a lens barrel 130. The lens elements 111, 112 and the plastic lens element set are disposed in the lens barrel 130. The plastic lens element set includes two plastic lens elements (their references are omitted) and at least one anti-reflective layer 123. The two plastic lens elements in order from an object side to an image side along the optical axis X are a first plastic lens element 121 and a second plastic lens element 122. The anti-reflective layer 123 has a nanostructure and is disposed on at least one of an image-side surface of the first plastic lens element 121 and an object-side surface of the second plastic lens element 122.

Via the fact that low reflectivity can be achieved by an air gap 120 formed between the image-side surface of the first plastic lens element 121 and the object-side surface of the second plastic lens element 122, and the anti-reflective layer 123 having the nanostructure is disposed on at least one of two respective plastic lens element surface at two sides of the air gap 120 (according to the 1st embodiment, the anti-reflective layer 123 is disposed on the object-side surface of the second plastic lens element 122 which is located on an image side of the air gap 120), high intensity of reflective light can be largely reduced in the narrowed air gap 120 of the plastic lens element set. In the result, resolving power of the imaging lens assembly 100 won't be limited by the over-high reflectance of surfaces of lens elements so that the allowance of optical design can be improved. Hence, resolving power of the imaging lens assembly 100 can be improved.

In FIG. 1A, the imaging lens assembly 100 includes the two lens elements 111, 112. The two lens elements 111, 112 are disposed along the optical axis X in order from an object side of the plastic lens element set (that is, an object side of the first plastic lens element 121). In detail, the imaging lens assembly 100 can further include two light blocking sheets 111a, 112b, two spacers 112a, 121a and a retainer 122a. The light blocking sheet 111a is located between the two lens elements 111, 112, the spacer 112a is located between the lens element 112 and the first plastic lens element 121, the light blocking sheet 112b is located between the spacer 112a and the second plastic lens element 122, the spacer 121a is located between the first plastic lens element 121 and the second plastic lens element 122, and the retainer 122a is disposed on an image side of the second plastic lens element 122. It has to be specified that optical features of lens elements of the imaging lens assembly 100 such as numbers, structures, surface shapes, and etc. and configuration of other elements can be utilized according to different imaging requirements, and other optical elements can also be disposed in necessary, but the present disclosure is not limited thereto.

Moreover, the imaging lens assembly 100 can further include a first light blocking sheet 140. The first light blocking sheet 140 is disposed between the first plastic lens element 121 and the second plastic lens element 122, and has an opening (its reference is omitted). In the 1st embodiment, the first light blocking sheet 140 is disposed between the spacer 121a and the second plastic lens element 122. Via the configuration of the first light blocking sheet 140, the non-imaging light after reflection can be further blocked. Hence, the light along the redundant reflective path between the first plastic lens element 121 and the second plastic lens element 122 can be reduced.

In the 1st embodiment, the image-side surface of the first plastic lens element 121 and the object-side surface of the second plastic lens element 122 are aspheric, but the present disclosure is not limited thereto. The structural design of aspheric surfaces can effectively regulate the optical quality of each peripheral imaging region of the image-side surface of the first plastic lens element 121 and the object-side surface of the second plastic lens element 122. Moreover, the design of inflection point can be provided so as to effectively adjust the condensing quality of light and improve uniformity of the thicknesses of the first plastic lens element 121 and the second plastic lens element 122. In the result, it can be avoided that the thickness variation of the plastic lens elements changes too much for influencing the coating quality of the anti-reflective layer 123. Hence, it can be avoided that the thickness variation from the center to the edge of each of the plastic lens elements changes drastically so as to influence the quality of injection molding of the plastic lens elements, and the failure possibility of coating can be decreased.

Moreover, the anti-reflective layer 123 can include a metal oxide layer. Specifically, the metal oxide layer can be formed by ALD, PVD, such as evaporative PVD or sputtering PVD. The metal oxide layer can also be formed by CVD such as ultrahigh vacuum CVD, microwave plasma-assisted CVD, plasma-enhanced CVD, or atomic layer CVD. In the 1st embodiment, the metal oxide layer of the anti-reflective layer 123 is made of aluminum oxide, but the present disclosure is not limited thereto.

It is worth to be mentioned that a minimum air gap AG1 (labeled in FIG. 1B) between the off-axis region of the image-side surface of the first plastic lens element 121 and the off-axis region of the object-side surface of the second plastic lens element 122 is located between an optical effective region of the image-side surface of the first plastic lens element 121 and an optical effective region of the object-side surface of the second plastic lens element 122. The minimum air gap AG1 between the off-axis region of the image-side surface of the first plastic lens element 121 and the off-axis region of the object-side surface of the second plastic lens element 122 is formed on the anti-reflective layer 123. Via the configuration of the first plastic lens element 121 and the second plastic lens element 122, the reflective intensity of primary or secondary reflection light can be directly reduced so as to avoid the condition that the light intensity has to be reduced after multiple reflection. Hence, intensity of reflective light in the narrowed air gap 120 can be effectively reduced.

Figure 1B:
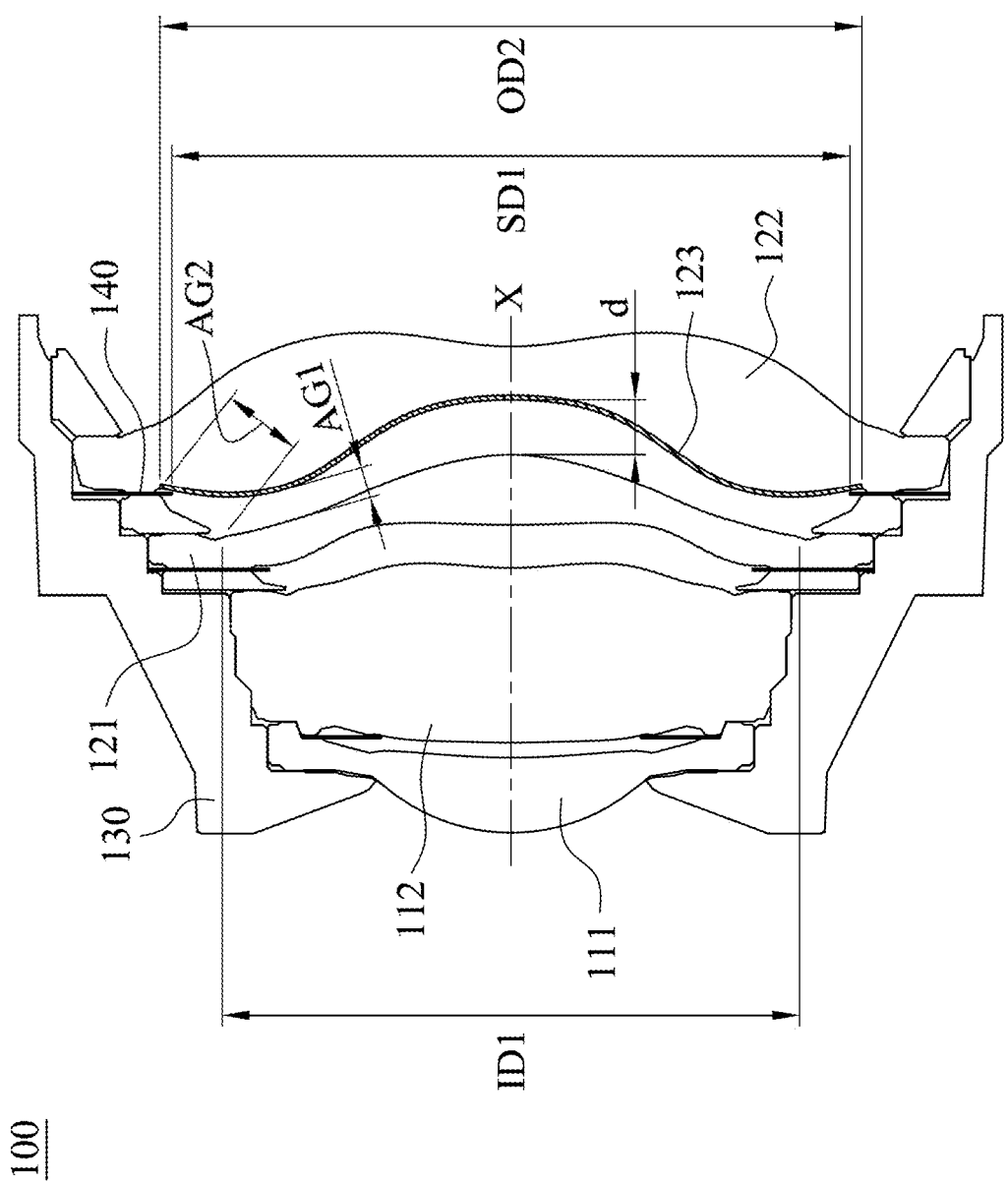
FIG. 1B shows a schematic view of parameters of the imaging lens assembly according to the 1st embodiment in FIG. 1A.

FIG. 1B shows a schematic view of parameters of the imaging lens assembly 100 according to the 1st embodiment in FIG. 1A. In FIG. 1B, when the minimum air gap between the off-axis region of the image-side surface of the first plastic lens element 121 and the off-axis region of the object-side surface of the second plastic lens element 122 is AG1, a peripheral air gap between an edge of the optical effective region of the image-side surface of the first plastic lens element 121 and an edge of the optical effective region of the object-side surface of the second plastic lens element 122 is AG2, a central distance between a paraxial region of the image-side surface of the first plastic lens element 121 and a paraxial region of the object-side surface of the second plastic lens element 122 is d, a diameter of the optical effective region of the image-side surface of the first plastic lens element 121 is ID1, a diameter of the optical effective region of the object-side surface of the second plastic lens element 122 is OD2, and a diameter of the opening of the first light blocking sheet 140 is SD1, the conditions related to the parameters can be satisfied as the following Table 1.

TABLE 1

| the 1st embodiment | | | |
|---|---|---|---|
| AG1 (mm) | 0.344 | AG1/AG2 | 0.398 |
| AG2 (mm) | 0.864 | AG1/d | 0.578 |
| d (mm) | 0.595 | AG2/d | 1.452 |
| ID1 (mm) | 6.28 | OD2 (mm) | 7.64 |
| SD1 (mm) | 7.38 | | |

Figure 5:
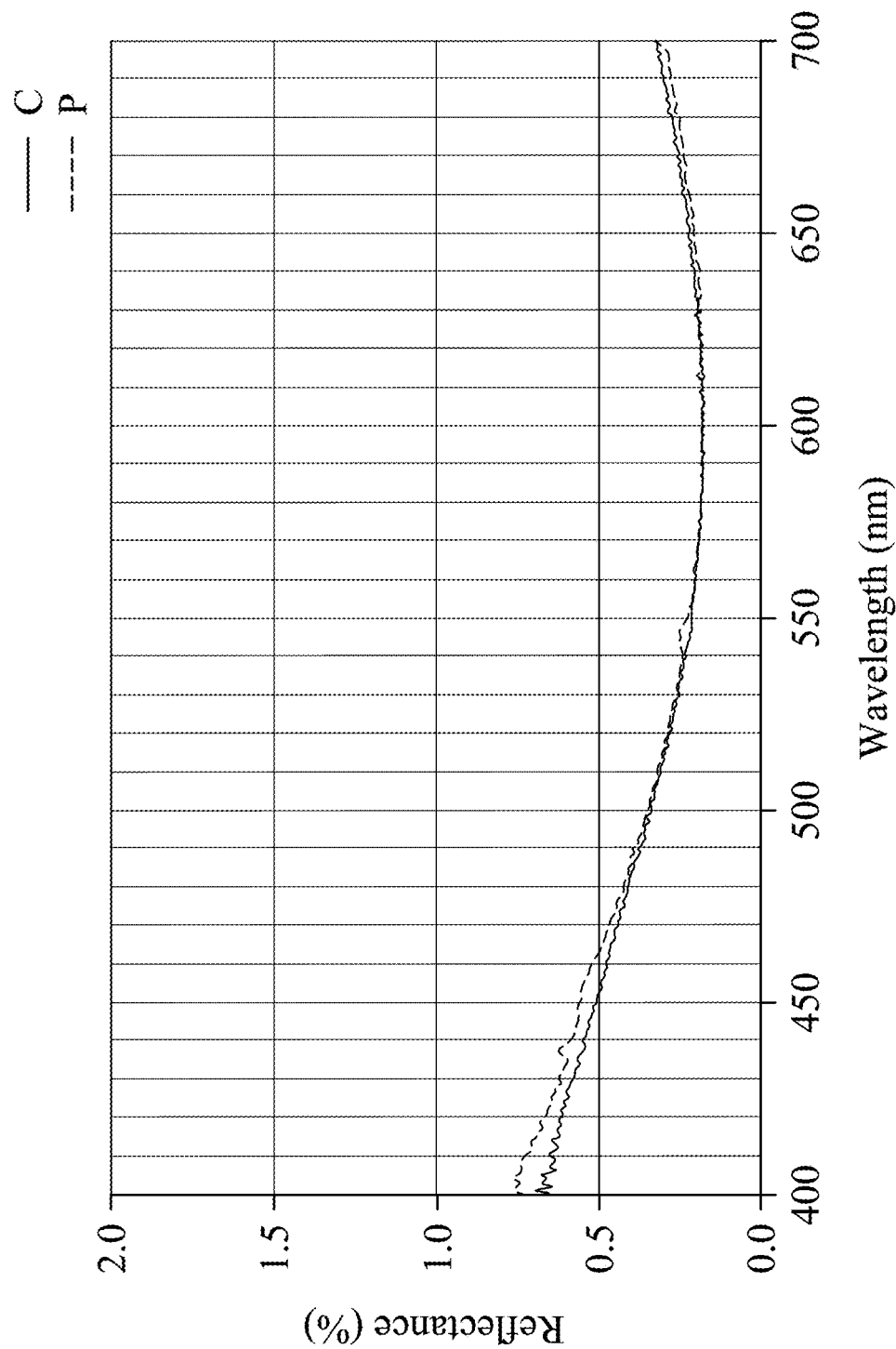
FIG. 5 shows a schematic view of a relation between a wavelength and reflectance of the anti-reflective layer according to the 1st embodiment in FIG. 1A.

FIG. 5 shows a schematic view of a relation between a wavelength and reflectance of the anti-reflective layer 123 in FIG. 1A according to the 1st embodiment. In FIG. 5, a continuous line segment C represents reflectance of the anti-reflective layer 123 at a center of the optical effective region, and a broken line segment P represents reflectance of the anti-reflective layer 123 at an edge of the optical effective region. Hence, in the condition that the unnecessary surface reflection in a wavelength region of visible light can be effectively reduced, the extensive capability for removing stray light can be provided.

2nd Embodiment

Figure 2A:
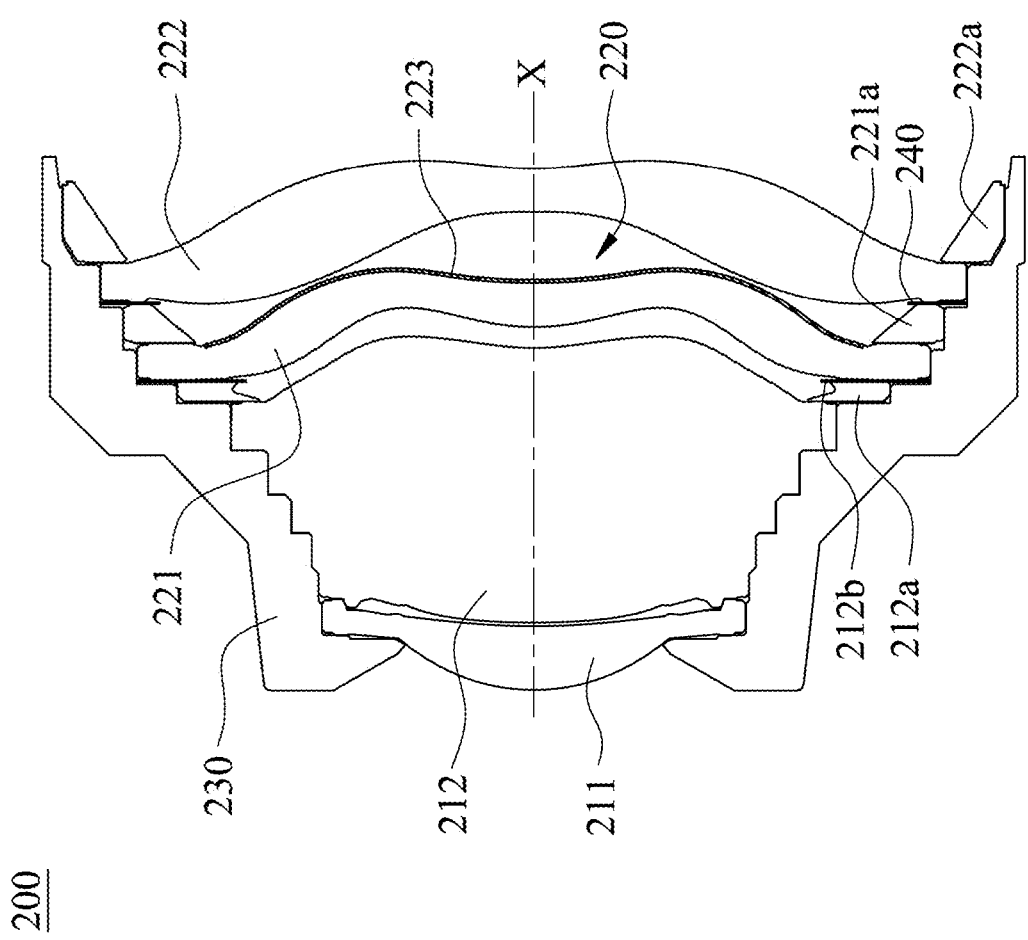
FIG. 2A shows a schematic view of an imaging lens assembly according to the 2nd embodiment of the present disclosure.

FIG. 2A shows a schematic view of an imaging lens assembly 200 according to the 2nd embodiment of the present disclosure. In FIG. 2A, the imaging lens assembly 200 has an optical axis X and includes a plurality of lens elements 211, 212, a plastic lens element set (its reference is omitted) and a lens barrel 230. The lens elements 211, 212 and the plastic lens element set are disposed in the lens barrel 230. The plastic lens element set includes two plastic lens elements (their references are omitted) and an anti-reflective layer 223. The two plastic lens elements in order from an object side to an image side along the optical axis X are a first plastic lens element 221 and a second plastic lens element 222. The anti-reflective layer 223 has a nano-structure and is disposed on at least one of an image-side surface of the first plastic lens element 221 and an object-side surface of the second plastic lens element 222.

Via the fact that low reflectivity can be achieved by an air gap 220 formed between the image-side surface of the first plastic lens element 221 and the object-side surface of the second plastic lens element 222, and the anti-reflective layer 223 having the nanostructure is disposed on at least one of two respective plastic lens element surface at two sides of the air gap 220 (according to the 2nd embodiment, the anti-reflective layer 223 is disposed on the image-side surface of the first plastic lens element 221 which is located on an object side of the air gap 220), high intensity of reflective light can be largely reduced in the air gap 220 which is a narrowed gap. In the result, resolving power of the imaging lens assembly 200 won't be limited by the over-high reflectance of surfaces of lens elements so that the allowance of optical design can be improved. Hence, resolving power of the imaging lens assembly 200 can be improved.

In FIG. 2A, the imaging lens assembly 200 includes the two lens elements 211, 212. The two lens elements 211, 212 are disposed along the optical axis X in order from an object side of the plastic lens element set (that is, an object side of the first plastic lens element 221). In detail, the imaging lens assembly 200 can further include two spacers 212a, 221a, a light blocking sheet 212b, and a retainer 222a. The spacer 212a is located between the lens element 212 and the first plastic lens element 221, the light blocking sheet 212b is located between the spacer 212a and the first plastic lens element 221, the spacer 221a is located between the first plastic lens element 221 and the second plastic lens element 222, and the retainer 222a is disposed on an image side of the second plastic lens element 222. It has to be specified that optical features of lens elements of the imaging lens assembly 200 such as numbers, structures, surface shapes, and etc. and configuration of other elements can be utilized according to different imaging requirements, and other optical elements can also be disposed in necessary, but the present disclosure is not limited thereto.

Moreover, the imaging lens assembly 200 can further include a first light blocking sheet 240. The first light blocking sheet 240 is disposed between the first plastic lens element 221 and the second plastic lens element 222, and has an opening (its reference is omitted). In the 2nd embodiment, the first light blocking sheet 240 is disposed between the spacer 221a and the second plastic lens element 222. Via the configuration of the first light blocking sheet 240, the non-imaging light after reflection can be further blocked. Hence, the light along the redundant reflective path between the first plastic lens element 221 and the second plastic lens element 222 can be reduced.

In the 2nd embodiment, both of the image-side surface of the first plastic lens element 221 and the object-side surface of the second plastic lens element 222 are aspheric, but the present disclosure is not limited thereto. The structural design of aspheric surfaces can effectively regulate the optical quality of each peripheral imaging region of the image-side surface of the first plastic lens element 221 and the object-side surface of the second plastic lens element 222. Moreover, the design of inflection point can be provided so as to effectively adjust the condensing quality of light and improve uniformity of the thicknesses of the first plastic lens element 221 and the second plastic lens element 222. In the result, it can be avoided that the thickness variation of the plastic lens elements changes too much for influencing the coating quality of the anti-reflective layer 223. Hence, it can be avoided that the thickness variation from the center to the edge of each of the plastic lens elements changes drastically so as to influence the quality of injection molding of the plastic lens elements, and the failure possibility of coating can be decreased.

Moreover, the anti-reflective layer 223 can include a metal oxide layer and a silicon oxide layer. Specifically, the metal oxide layer and the silicon oxide layer can be formed by ALD, PVD, such as evaporative PVD or sputtering PVD. The metal oxide layer and the silicon oxide layer can also be formed by CVD such as ultrahigh vacuum CVD, microwave plasma-assisted CVD, plasma-enhanced CVD, or atomic layer CVD. In the 2nd embodiment, the metal oxide layer is made of aluminum oxide. In detail, the metal oxide layer is disposed on the image-side surface of the first plastic lens element 221, the silicon oxide layer is disposed between the metal oxide layer and the image-side surface of the first plastic lens element 221, but the present disclosure is not limited thereto. Hence, via the configuration of different oxide layers, reflectance of the anti-reflective layer can be adjusted according to requirements.

It is worth to be mentioned that a minimum air gap AG1 (labeled in FIG. 2B) between the off-axis region of the image-side surface of the first plastic lens element 221 and the off-axis region of the object-side surface of the second plastic lens element 222 is located between an optical effective region of the image-side surface of the first plastic lens element 221 and an optical effective region of the object-side surface of the second plastic lens element 222. The minimum air gap AG1 between the off-axis region of the image-side surface of the first plastic lens element 221 and the off-axis region of the object-side surface of the second plastic lens element 222 is formed on the anti-reflective layer 223. Via the configuration of the first plastic lens element 221 and the second plastic lens element 222, the reflective intensity of primary or secondary reflection light can be directly reduced so as to avoid the condition that the light intensity has to be reduced after multiple reflection. Hence, intensity of reflective light in the narrowed air gap can be effectively reduced.

Figure 2B:
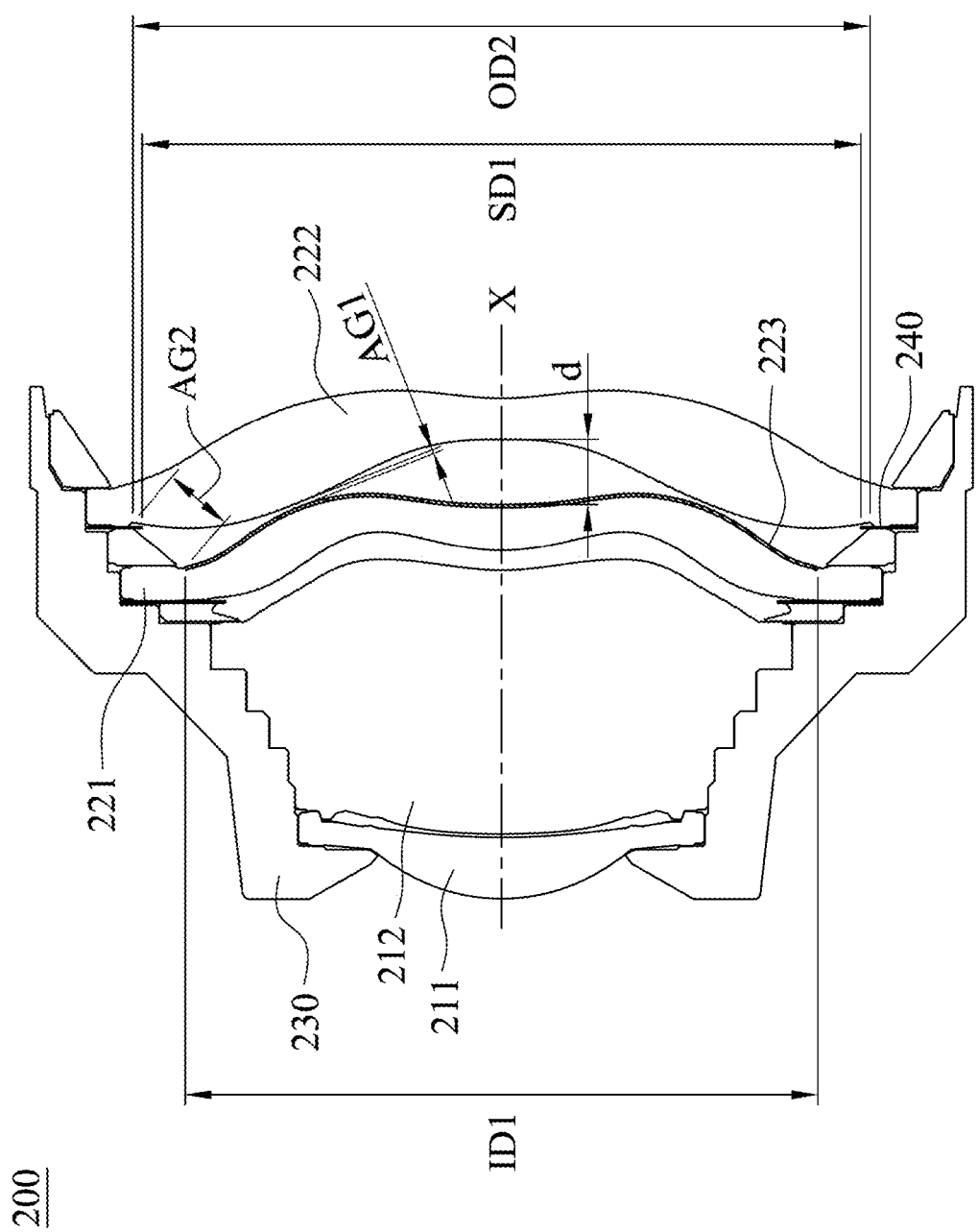
FIG. 2B shows a schematic view of parameters of the imaging lens assembly according to the 2nd embodiment in FIG. 2A.

FIG. 2B shows a schematic view of parameters of the imaging lens assembly 200 according to the 2nd embodiment in FIG. 2A. In FIG. 2B, when the minimum air gap between the off-axis region of the image-side surface of the first plastic lens element 221 and the off-axis region of the object-side surface of the second plastic lens element 222 is AG1, a peripheral air gap between an edge of the optical effective region of the image-side surface of the first plastic lens element 221 and an edge of the optical effective region of the object-side surface of the second plastic lens element 222 is AG2, a central distance between a paraxial region of the image-side surface of the first plastic lens element 221 and a paraxial region of the object-side surface of the second plastic lens element 222 is d, a diameter of the optical effective region of the image-side surface of the first plastic lens element 221 is ID1, a diameter of the optical effective region of the object-side surface of the second plastic lens element 222 is OD2, and a diameter of the opening of the first light blocking sheet 240 is SD1, the conditions related to the parameters can be satisfied as the following Table 2.

TABLE 2

| the 2nd embodiment | | | |
|---|---|---|---|
| AG1 (mm) | 0.061 | AG1/AG2 | 0.057 |
| AG2 (mm) | 1.069 | AG1/d | 0.061 |
| d (mm) | 1.002 | AG2/d | 1.067 |
| ID1 (mm) | 9.8 | OD2 (mm) | 11.42 |
| SD1 (mm) | 11.13 | | |

Figure 6:
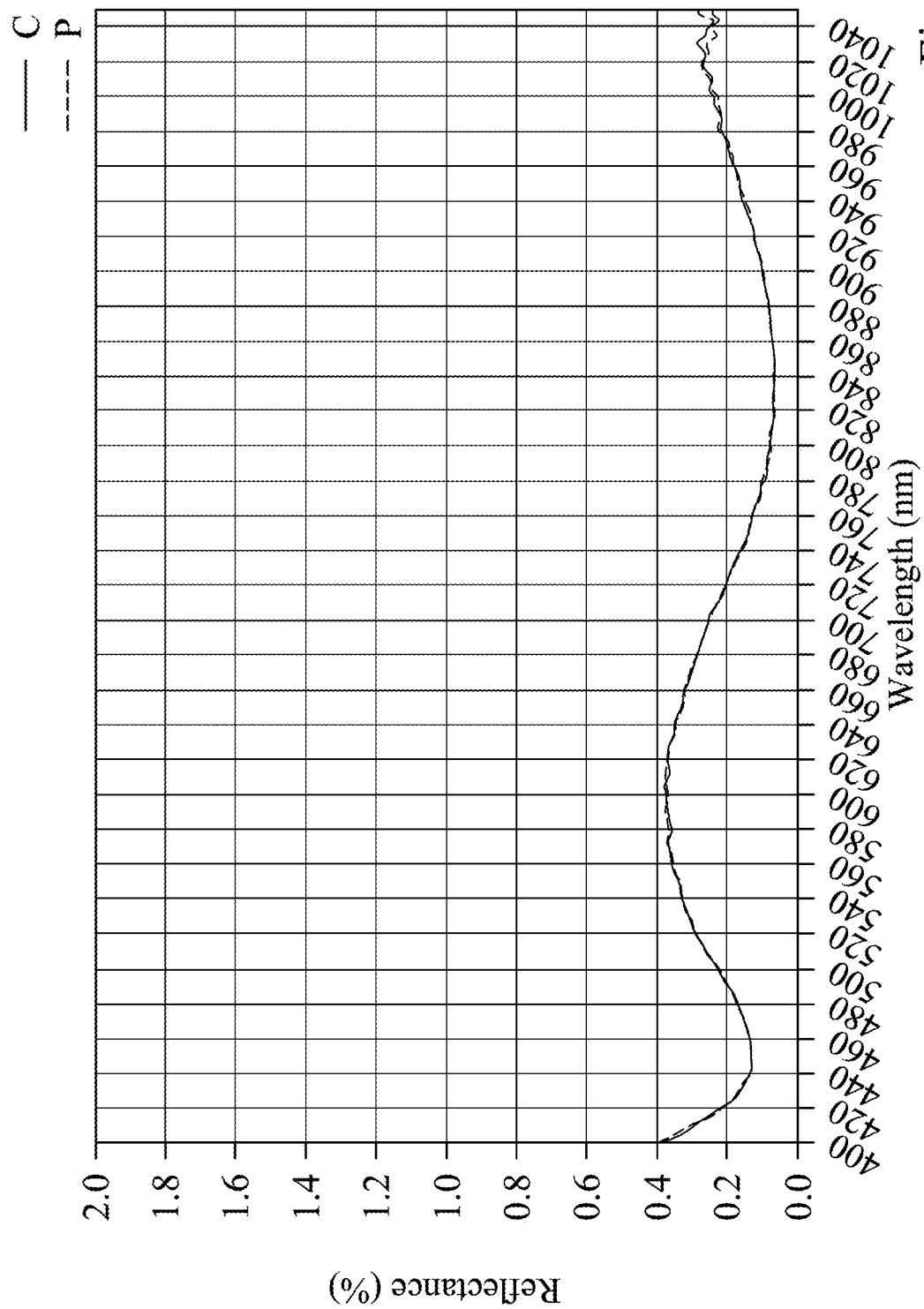
FIG. 6 shows a schematic view of a relation between a wavelength and reflectance of the anti-reflective layer according to the 2nd embodiment in FIG. 2A.

FIG. 6 shows a schematic view of a relation between a wavelength and reflectance of the anti-reflective layer 223 according to the 2nd embodiment in FIG. 2A. In FIG. 6, a continuous line segment C represents reflectance of the anti-reflective layer 223 at a center of the optical effective region, and a broken line segment P represents reflectance of the anti-reflective layer 223 at an edge of the optical effective region. Hence, in the condition that the unnecessary surface reflection in a wavelength region of visible light can be effectively reduced, the extensive capability for removing stray light can be provided. Moreover, while further attenuating the reflective light in a wavelength region of infrared light, the reflection of infrared light caused by a heating light source during a real shooting can be reduced.

3rd Embodiment

Figure 3A:
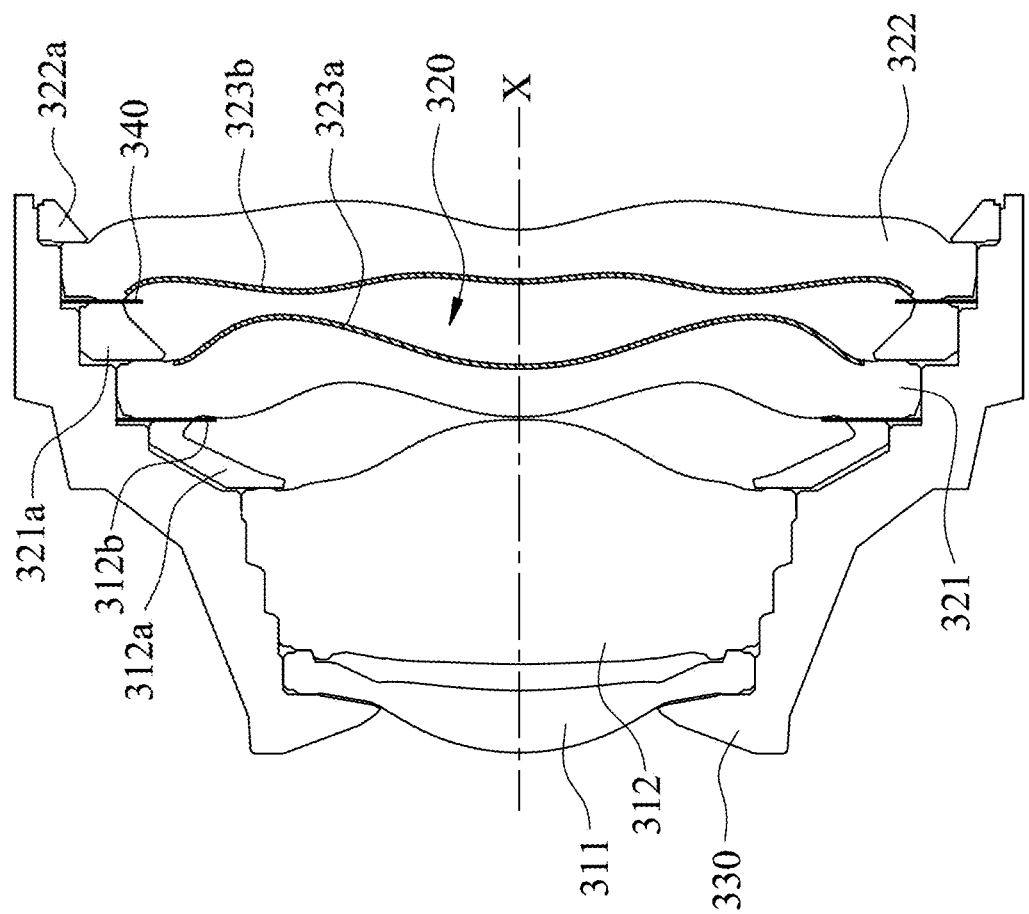
FIG. 3A shows a schematic view of an imaging lens assembly according to the 3rd embodiment of the present disclosure.

FIG. 3A shows a schematic view of an imaging lens assembly 300 according to the 3rd embodiment of the present disclosure. In FIG. 3A, the imaging lens assembly 300 has an optical axis X and includes a plurality of lens elements 311, 312, a plastic lens element set (its reference is omitted) and a lens barrel 330. The lens elements 311, 312 and the plastic lens element set are disposed in the lens barrel 330. The plastic lens element set includes two plastic lens elements (its reference is omitted) and two anti-reflective layers 323a, 323b. The two plastic lens elements in order from an object side to an image side along the optical axis X are a first plastic lens element 321 and a second plastic lens element 322. Each of the anti-reflective layers 323a, 323b has a nanostructure and is disposed on an image-side surface of the first plastic lens element 321 and an object-side surface of the second plastic lens element 322.

Via the fact that low reflectivity can be achieved by an air gap 320 formed between the image-side surface of the first plastic lens element 321 and the object-side surface of the second plastic lens element 322, and the anti-reflective layers 323a, 323b having the nanostructure are disposed on at least one of two respective plastic lens element surface at two sides of the air gap 320 (according to the 3rd embodiment, the anti-reflective layer 323a is disposed on the image-side surface of the first plastic lens element 321 at an object side of the air gap 320, and the anti-reflective layer 323b is disposed on the object-side surface of the second plastic lens element 322 which is located on an image side of the air gap 320), high intensity of reflective light can be largely reduced in the air gap 320 which is a narrowed gap. In the result, resolving power of the imaging lens assembly 300 won't be limited by the over-high reflectance of surfaces of lens elements so that the allowance of optical design can be improved. Hence, resolving power of the imaging lens assembly 300 can be improved.

In FIG. 3A, the imaging lens assembly 300 includes the two lens elements 311, 312. The two lens elements 311, 312 are disposed along the optical axis X in order from an object side of the plastic lens element set (that is, an object side of the first plastic lens element 321). In detail, the imaging lens assembly 300 can further include two spacers 312a, 321a, a light blocking sheet 312b, and a retainer 322a. The spacer 312a is located between the lens element 312 and the first plastic lens element 321, the light blocking sheet 312b is located between the spacer 312a and the first plastic lens element 321, the spacer 321a is located between the first plastic lens element 321 and the second plastic lens element 322, and the retainer 322a is disposed on an image side of the second plastic lens element 322. It has to be specified that optical features of lens elements of the imaging lens assembly 300 such as numbers, structures, surface shapes, and etc. and configuration of other elements can be utilized according to different imaging requirements, and other optical elements can also be disposed in necessary, but the present disclosure is not limited thereto.

Moreover, the imaging lens assembly 300 can further include a first light blocking sheet 340. The first light blocking sheet 340 is disposed between the first plastic lens element 321 and the second plastic lens element 322, and has an opening (its reference is omitted). In the 3rd embodiment, the first light blocking sheet 340 is disposed between the spacer 321a and the second plastic lens element 322. Via the configuration of the first light blocking sheet 340, the non-imaging light after reflection can be further blocked. Hence, the light along the redundant reflective path between the first plastic lens element 321 and the second plastic lens element 322 can be reduced.

In the 3rd embodiment, the image-side surface of the first plastic lens element 321 and the object-side surface of the second plastic lens element 322 are aspheric, but the present disclosure is not limited thereto. The structural design of aspheric surfaces can effectively regulate the optical quality of each peripheral imaging region of the image-side surface of the first plastic lens element 321 and the object-side surface of the second plastic lens element 322. Moreover, the design of inflection point can be provided so as to effectively adjust the condensing quality of light and improve uniformity of the thicknesses of the first plastic lens element 321 and the second plastic lens element 322. In the result, it can be avoided that the thickness variation of the plastic lens elements changes too much for influencing the coating quality of the anti-reflective layers 323a, 323b. Hence, it can be avoided that the thickness variation from the center to the edge of each of the plastic lens elements changes drastically so as to influence the quality of injection molding of the plastic lens elements, and the failure possibility of coating can be decreased.

Moreover, each of the anti-reflective layers 323a, 323b can include a metal oxide layer. Specifically, the metal oxide layer can be formed by ALD, PVD, such as evaporative PVD or sputtering PVD. The metal oxide layer can also be formed by CVD such as ultrahigh vacuum CVD, microwave plasma-assisted CVD, plasma-enhanced CVD, or atomic layer CVD. In the 3rd embodiment, the metal oxide layer is made of aluminum oxide, but the present disclosure is not limited thereto.

It is worth to be mentioned that a minimum air gap AG1 (labeled in FIG. 3B) between the off-axis region of the image-side surface of the first plastic lens element 321 and the off-axis region of the object-side surface of the second plastic lens element 322 is located between an optical effective region of the image-side surface of the first plastic lens element 321 and an optical effective region of the object-side surface of the second plastic lens element 322. The minimum air gap AG1 between the off-axis region of the image-side surface of the first plastic lens element 321 and the off-axis region of the object-side surface of the second plastic lens element 322 is formed between the anti-reflective layers 323a, 323b. Via the configuration of the first plastic lens element 321 and the second plastic lens element 322, the reflective intensity of primary or secondary reflection light can be directly reduced so as to avoid the condition that the light intensity has to be reduced after multiple reflection. Hence, intensity of reflective light in the narrowed air gap can be effectively reduced.

Figure 3B:
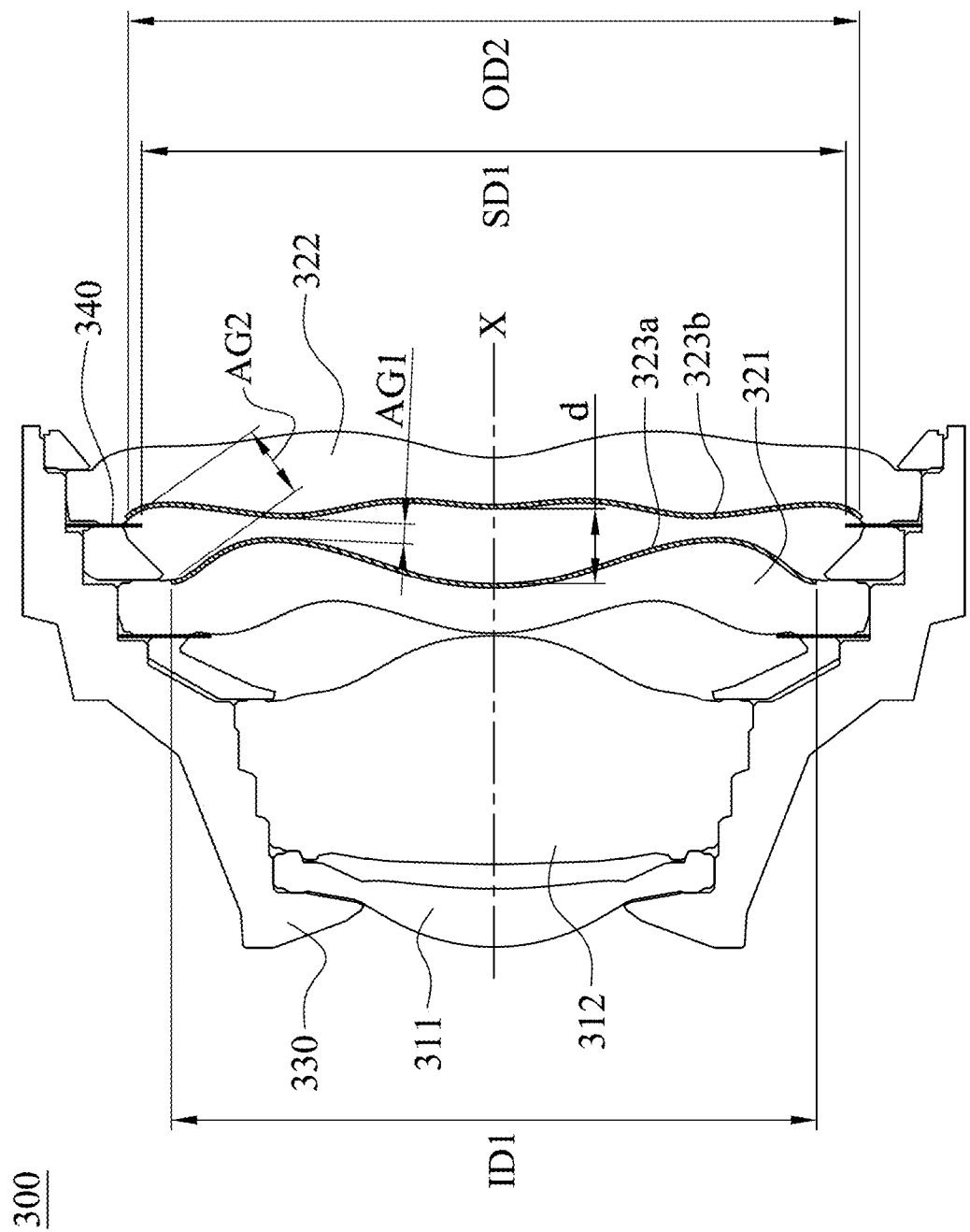
FIG. 3B shows a schematic view of parameters of the imaging lens assembly according to the 3rd embodiment in FIG. 3A.

FIG. 3B shows a schematic view of parameters of the imaging lens assembly 300 according to the 3rd embodiment in FIG. 3A. In FIG. 3B, when the minimum air gap between the off-axis region of the image-side surface of the first plastic lens element 321 and the off-axis region of the object-side surface of the second plastic lens element 322 is AG1, a peripheral air gap between an edge of the optical effective region of the image-side surface of the first plastic lens element 321 and an edge of the optical effective region of the object-side surface of the second plastic lens element 322 is AG2, a central distance between a paraxial region of the image-side surface of the first plastic lens element 321 and a paraxial region of the object-side surface of the second plastic lens element 322 is d, a diameter of the optical effective region of the image-side surface of the first plastic lens element 321 is ID1, a diameter of the optical effective region of the object-side surface of the second plastic lens element 322 is OD2, and a diameter of the opening of the first light blocking sheet 340 is SD1, the conditions related to the parameters can be satisfied as the following Table 3.

TABLE 3

| the 3rd embodiment | | | |
|---|---|---|---|
| AG1 (mm) | 0.229 | AG1/AG2 | 0.266 |
| AG2 (mm) | 0.86 | AG1/d | 0.264 |
| d (mm) | 0.867 | AG2/d | 0.992 |
| ID1 (mm) | 7.465 | OD2 (mm) | 8.46 |
| SD1 (mm) | 8.15 | | |

A relation between a wavelength and reflectance of each of the anti-reflective layers 323a, 323b in the 3rd embodiment is as the same as the relation between the wavelength and the reflectance of the anti-reflective layer 123 in the 1st embodiment, and will not be mentioned again.

4th Embodiment

Figure 4A:
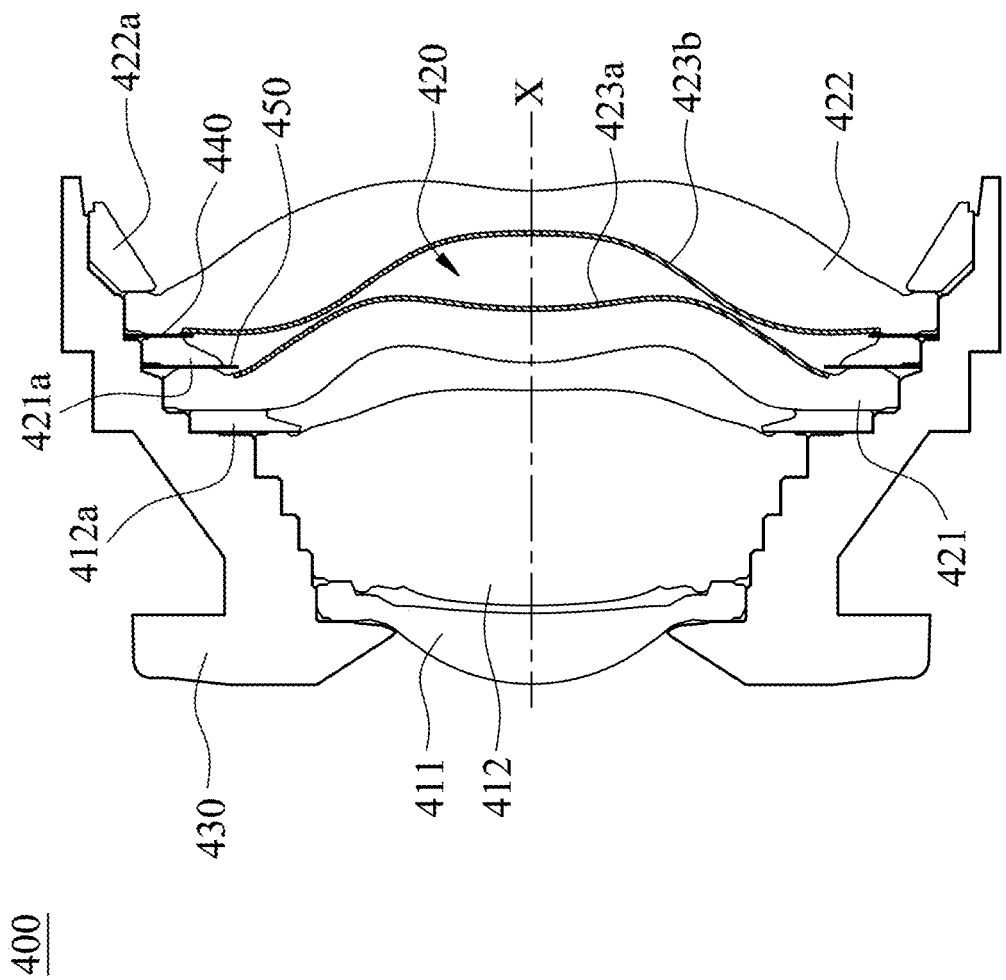
FIG. 4A shows a schematic view of an imaging lens assembly according to the 4th embodiment of the present disclosure.

FIG. 4A shows a schematic view of an imaging lens assembly 400 according to the 4th embodiment of the present disclosure. In FIG. 4A, the imaging lens assembly 400 has an optical axis X and includes a plurality of lens elements 411, 412, a plastic lens element set (its reference is omitted) and a lens barrel 430. The lens elements 411, 412 and the plastic lens element set are disposed in the lens barrel 430. The plastic lens element set includes two plastic lens elements (their references are omitted) and two anti-reflective layers 423a, 423b. The two plastic lens elements in order from an object side to an image side along the optical axis X are a first plastic lens element 421 and a second plastic lens element 422. Each of the anti-reflective layers 423a, 423b has a nanostructure and is disposed on an image-side surface of the first plastic lens element 421 and an object-side surface of the second plastic lens element 422.

Via the fact that low reflectivity can be achieved by an air gap 420 formed between the image-side surface of the first plastic lens element 421 and the object-side surface of the second plastic lens element 422, and the anti-reflective layers 423a, 423b having the nanostructure are disposed on at least one of two respective plastic lens element surface at two sides of the air gap 420 (according to the 4th embodiment, the anti-reflective layer 423a is disposed on the image-side surface of the first plastic lens element 421, and the anti-reflective layer 423b is disposed on the object-side surface of the second plastic lens element 422), high intensity of reflective light can be largely reduced in the air gap 420 which is a narrowed gap. In the result, resolving power of the imaging lens assembly 400 won't be limited by the over-high reflectance of surfaces of lens elements so that the allowance of optical design can be improved. Hence, resolving power of the imaging lens assembly 400 can be improved.

In FIG. 4A, the imaging lens assembly 400 includes the two lens elements 411, 412. The two lens elements 411, 412 are disposed along the optical axis X in order from an object side of the plastic lens element set (that is, an object side of the first plastic lens element 421). In detail, the imaging lens assembly 400 can further include two spacers 412a, 221a and a retainer 422a. The spacer 412a is located between the lens element 412 and the first plastic lens element 421, the spacer 421a is located between the first plastic lens element 421 and the second plastic lens element 422, and the retainer 422a is disposed on an image side of the second plastic lens element 422. It has to be specified that optical features of lens elements of the imaging lens assembly 400 such as numbers, structures, surface shapes, and etc. and configuration of other elements can be utilized according to different imaging requirements, and other optical elements can also be disposed in necessary, but the present disclosure is not limited thereto.

Moreover, the imaging lens assembly 400 can further include a first light blocking sheet 440. The first light blocking sheet 440 is disposed between the first plastic lens element 421 and the second plastic lens element 422, and has an opening (its reference is omitted). In the 4th embodiment, the first light blocking sheet 440 is disposed between the spacer 421a and the second plastic lens element 422. Via the configuration of the first light blocking sheet 440, the non-imaging light after reflection can be further blocked. Hence, the light along the redundant reflective path between the first plastic lens element 421 and the second plastic lens element 422 can be reduced.

The imaging lens assembly 400 can further include a second light blocking sheet 450. The second light blocking sheet 450 is disposed between the first plastic lens element 421 and the second plastic lens element 422, and has an opening (its reference is omitted). In the 4th embodiment, the second light blocking sheet 450 is disposed between the first plastic lens element 421 and the spacer 421a. Via the configuration of the second light blocking sheet 450, the light trap can be formed between the first plastic lens element 421 and the second plastic lens element 422. Hence, ghosting images occurring in the dark background can be captured.

In the 4th embodiment, the image-side surface of the first plastic lens element 421 and the object-side surface of the second plastic lens element 422 are aspheric, but the present disclosure is not limited thereto. The structural design of aspheric surfaces can effectively regulate the optical quality of each peripheral imaging region of the image-side surface of the first plastic lens element 421 and the object-side surface of the second plastic lens element 422. Moreover, the design of inflection point can be provided so as to effectively adjust the condensing quality of light and improve uniformity of the thicknesses of the first plastic lens element 421 and the second plastic lens element 422. In the result, it can be avoided that the thickness variation of the plastic lens elements changes too much for influencing the coating quality of the anti-reflective layers 423a, 423b. Hence, it can be avoided that the thickness variation from the center to the edge of each of the plastic lens elements changes drastically so as to influence the quality of injection molding of the plastic lens elements, and the failure possibility of coating can be decreased.

Moreover, each of the anti-reflective layers 423a, 423b can include a metal oxide layer and a silicon oxide layer. Specifically, the metal oxide layer and the silicon oxide layer can be formed by ALD, PVD, such as evaporative PVD or sputtering PVD. The metal oxide layer and the silicon oxide layer can also be formed by CVD such as ultrahigh vacuum CVD, microwave plasma-assisted CVD, plasma-enhanced CVD, or atomic layer CVD. In the 4th embodiment, the metal oxide layers of the anti-reflective layers 423a, 423b are made of aluminum oxide. In detail, the metal oxide layer of the anti-reflective layer 423a is disposed on the image-side surface of the first plastic lens element 421, the metal oxide layer of the anti-reflective layer 423b is disposed on the object-side surface of the second plastic lens element 422, the silicon oxide layer of the anti-reflective layer 423a is disposed between the metal oxide layer of the anti-reflective layer 423a and the image-side surface of the first plastic lens element 421, the silicon oxide layer of the anti-reflective layer 423b is disposed between the metal oxide layer of the anti-reflective layer 423b and the object-side surface of the second plastic lens element 422, but the present disclosure is not limited thereto.

It is worth to be mentioned that a minimum air gap AG1 (labeled in FIG. 4B) between the off-axis region of the image-side surface of the first plastic lens element 421 and the off-axis region of the object-side surface of the second plastic lens element 422 is located between an optical effective region of the image-side surface of the first plastic lens element 421 and an optical effective region of the object-side surface of the second plastic lens element 422. The minimum air gap AG1 between the off-axis region of the image-side surface of the first plastic lens element 421 and the off-axis region of the object-side surface of the second plastic lens element 422 is formed between the anti-reflective layers 423a, 423b. Via the configuration of the first plastic lens element 421 and the second plastic lens element 422, the reflective intensity of primary or secondary reflection light can be directly reduced so as to avoid the condition that the light intensity has to be reduced after multiple reflection. Hence, intensity of reflective light in the narrowed air gap can be effectively reduced.

Figure 4B:
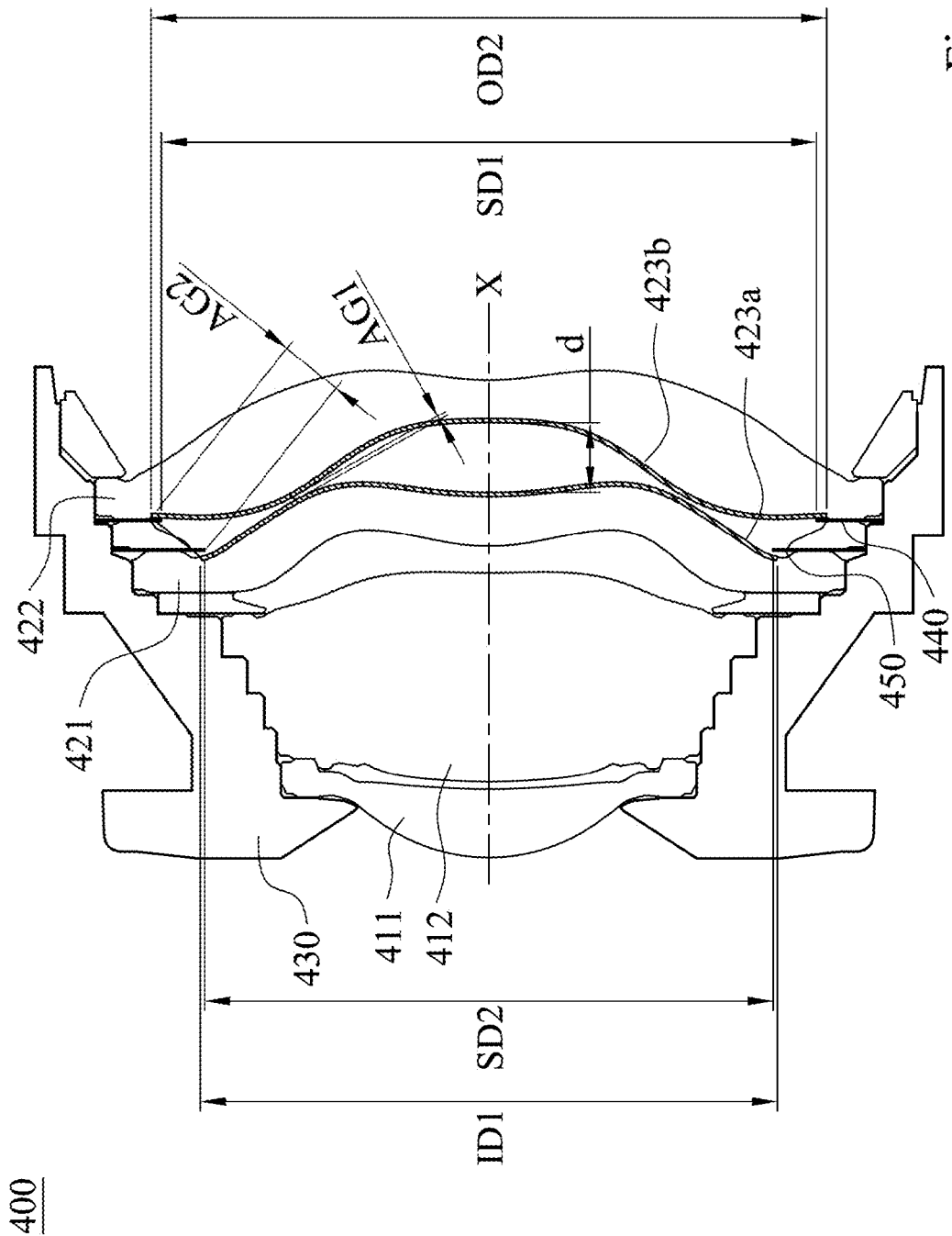
FIG. 4B shows a schematic view of parameters of the imaging lens assembly according to the 4th embodiment in FIG. 4A.

FIG. 4B shows a schematic view of parameters of the imaging lens assembly 400 according to the 4th embodiment in FIG. 4A. In FIG. 4B, when the minimum air gap between the off-axis region of the image-side surface of the first plastic lens element 421 and the off-axis region of the object-side surface of the second plastic lens element 422 is AG1, a peripheral air gap between an edge of the optical effective region of the image-side surface of the first plastic lens element 421 and an edge of the optical effective region of the object-side surface of the second plastic lens element 422 is AG2, a central distance between a paraxial region of the image-side surface of the first plastic lens element 421 and a paraxial region of the object-side surface of the second plastic lens element 422 is d, a diameter of the optical effective region of the image-side surface of the first plastic lens element 421 is ID1, a diameter of the optical effective region of the object-side surface of the second plastic lens element 422 is OD2, a diameter of the opening of the first light blocking sheet 440 is SD1, and a diameter of the opening of the second light blocking sheet 450 is SD2, the conditions related to the parameters can be satisfied as the following Table 4.

TABLE 4

| the 4th embodiment | | | |
|---|---|---|---|
| AG1 (mm) | 0.048 | AG1/AG2 | 0.065 |
| AG2 (mm) | 0.743 | AG1/d | 0.059 |
| d (mm) | 0.817 | AG2/d | 0.909 |
| ID1 (mm) | 6.8 | OD2 (mm) | 7.96 |
| SD1 (mm) | 7.72 | SD2 (mm) | 6.7 |

A relation between a wavelength and reflectance of each of the anti-reflective layers 423a, 423b in the 4th embodiment is as the same as the relation between the wavelength and the reflectance of the anti-reflective layer 223 in the 2nd embodiment, and will not be mentioned again.

5th Embodiment

Figure 9A:
FIG. 9A shows a schematic view of one side of an electronic device according to the 5th embodiment of the present disclosure.
Figure 9B:
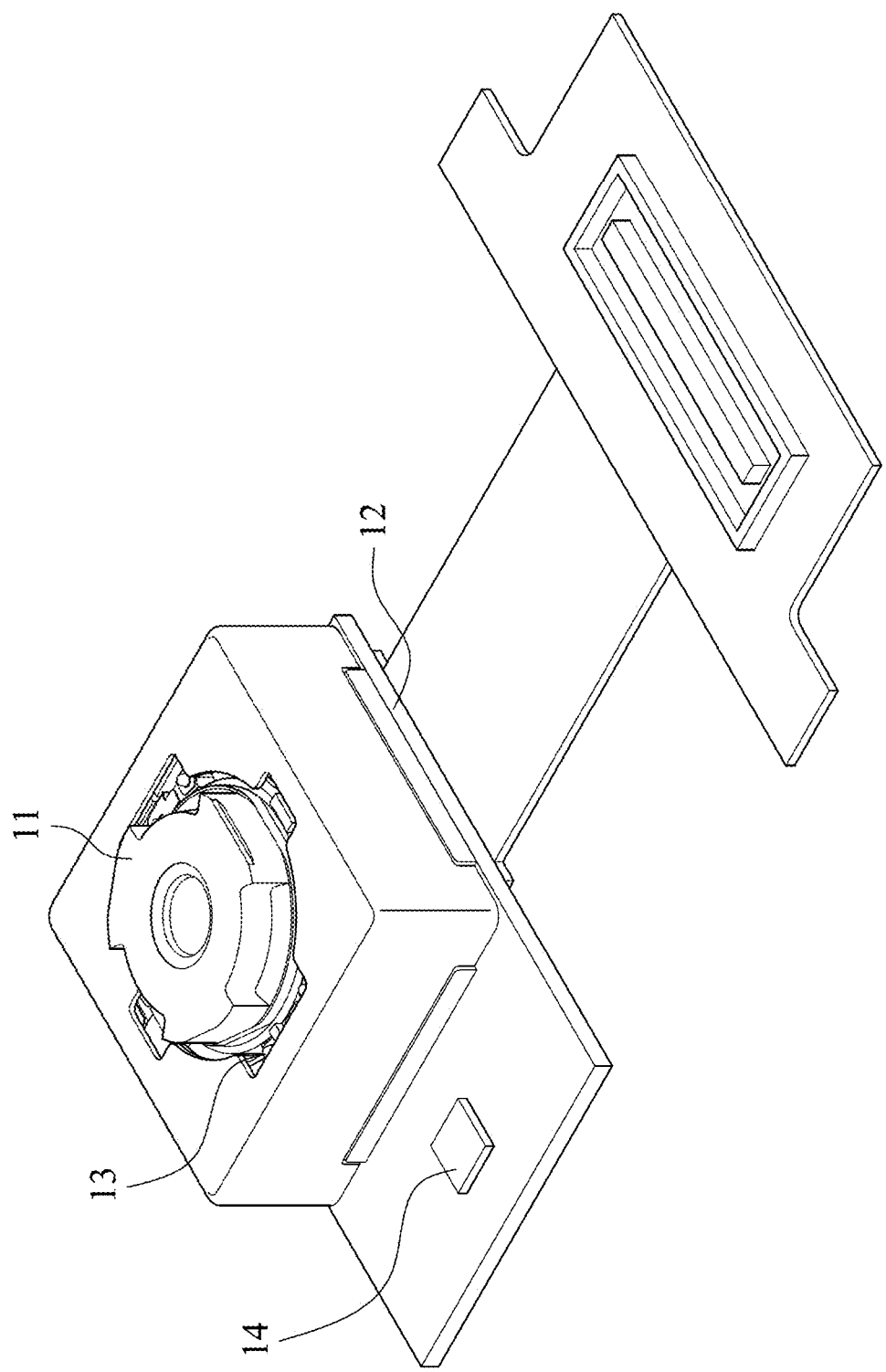
FIG. 9B shows a schematic view of imaging lens assemblies, image sensors, driving devices, and image stabilizing modules according to the 5th embodiment in FIG. 9A.

FIG. 9A shows a schematic view of one side of an electronic device 10 according to the 5th embodiment of the present disclosure. FIG. 9B shows a schematic view of imaging lens assemblies 11, image sensors 12, driving devices 13, and image stabilizing modules 14 according to the 5th embodiment in FIG. 9A. In the 5th embodiment, a number of the imaging lens assemblies 11 is three, a number of the image sensors 12 is three, but the present disclosure is not limited thereto. Each of the image sensors 12 is corresponding to each of the imaging lens assemblies 11. Furthermore, each of the imaging lens assemblies 11 can be one of the imaging lens assemblies according to the aforementioned 1st embodiment to the 4th embodiment, but the present disclosure is not limited thereto. Hence, it is favorable for fulfilling a mass production and an appearance requirement of an electronic device where the imaging lens assembly is carried on in the recent market of electronic devices.

In FIG. 9B, the electronic device 10 can further include driving devices 13 and image stabilizing modules 14. Each of the driving devices 13 and the image stabilizing modules 14 are corresponding to each of the imaging lens assemblies 11, respectively. The electronic device 10 converges light by the imaging lens assemblies 11, then captures an image from an object and operates image-focusing via the driving devices 13. Then, the image is imaged to the image sensor 12 and output to an image data.

The driving devices 13 can be auto-focus modules which are driven by driving systems such as voice coil motor, micro electro-mechanical systems, piezoelectric systems, shape memory alloy and etc. Via the driving devices 13, the optical image capturing lens assembly can be in the better imaging location so as to capture clear images in the condition that the object is in different object distance.

The image sensor 12 with high film speed and low noise can be accommodated in the electronic device 10 and disposed on an image surface of the imaging lens assemblies 11, so that a good imaging quality of the imaging lens assemblies 11 can be presented.

Moreover, the image stabilizing modules 14 can be kinetic sensing components, such as accelerators, gyroscopes, and Hall effect elements. In the 5th embodiment, the image stabilizing modules 14 can be the gyroscopes, but the present disclosure is not limited thereto. Hence, a blurred image caused by shaking can be compensated via adjusting various axial differences of the imaging lens assembly, and the imaging quality in dynamic and low illuminance can be further improved. Besides, the image compensating function such as optical image stabilization (OIS) and electronic image stabilization (EIS) can be provided.

The foregoing description, for purpose of explanation, has been described with reference to specific embodiments. It is to be noted that Tables show different data of the different embodiments; however, the data of the different embodiments are obtained from experiments. The embodiments were chosen and described in order to best explain the principles of the disclosure and its practical applications, to thereby enable others skilled in the art to best utilize the disclosure and various embodiments with various modifications as are suited to the particular use contemplated. The embodiments depicted above and the appended drawings are exemplary and are not intended to be exhaustive or to limit the scope of the present disclosure to the precise forms disclosed. Many modifications and variations are possible in view of the above teachings.

What is claimed is:

1. An imaging lens assembly, having an optical axis, comprising:
   a plastic lens element set, comprising:
   two plastic lens elements, in order from an object side to an image side along the optical axis being a first plastic lens element and a second plastic lens element; and
   at least one anti-reflective layer, having a nanostructure, and disposed on at least one of an image-side surface of the first plastic lens element and an object-side surface of the second plastic lens element;
   wherein a central distance between a paraxial region of the image-side surface of the first plastic lens element and a paraxial region of the object-side surface of the second plastic lens element is d, a minimum air gap between an off-axis region of the image-side surface of the first plastic lens element and an off-axis region of the object-side surface of the second plastic lens element is AG1, a peripheral air gap between an edge of an optical effective region of the image-side surface of the first plastic lens element and an edge of an optical effective region of the object-side surface of the second plastic lens element is AG2, the minimum air gap is formed on the at least one anti-reflective layer, a grain height of the nanostructure is gH, and the following conditions are satisfied:

$65 \text{ nm} < gH < 600 \text{ nm};$ $0.001 \leq AG1/d < 0.7;$ and $0.01 < AG1/AG2 < 0.9.$ 2. The imaging lens assembly of claim 1, wherein the at least one anti-reflective layer comprises a metal oxide layer.

3. The imaging lens assembly of claim 2, wherein the minimum air gap between the off-axis region of the image-side surface of the first plastic lens element and the off-axis region of the object-side surface of the second plastic lens element is located between the optical effective region of the image-side surface of the first plastic lens element and the optical effective region of the object-side surface of the second plastic lens element.

4. The imaging lens assembly of claim 1, wherein the peripheral air gap between the edge of the optical effective region of the image-side surface of the first plastic lens element and the edge of the optical effective region of the object-side surface of the second plastic lens element is AG2, the central distance between the paraxial region of the image-side surface of the first plastic lens element and the paraxial region of the object-side surface of the second plastic lens element is d, and the following condition is satisfied:

0.001<AG2/$d$<1.8.

5. The imaging lens assembly of claim 1, wherein the minimum air gap between the off-axis region of the image-side surface of the first plastic lens element and the off-axis region of the object-side surface of the second plastic lens element is AG1, the peripheral air gap between the edge of the optical effective region of the image-side surface of the first plastic lens element and the edge of the optical effective region of the object-side surface of the second plastic lens element is AG2, and the following condition is satisfied:

0.01<AG1/AG2<0.64.

6. The imaging lens assembly of claim 1, wherein the minimum air gap between the off-axis region of the image-side surface of the first plastic lens element and the off-axis region of the object-side surface of the second plastic lens element is AG1, and the following condition is satisfied:

0.001 mm<AG1<0.06 mm.

7. The imaging lens assembly of claim 1, wherein the grain height of the nanostructure is gH, and the following condition is satisfied:

85 nm<$gH$<470 nm.

8. The imaging lens assembly of claim 1, wherein a reflectance in a wavelength of 400 nm of the at least one anti-reflective layer is R400, a reflectance in a wavelength of 600 nm of the at least one anti-reflective layer is R600, a reflectance in a wavelength of 700 nm of the at least one anti-reflective layer is R700, and the following conditions are satisfied:

0.0%<$R$400≤1.0%;

0.0%<$R$600≤1.0%; and 0.0%<$R$700≤1.0%.

9. The imaging lens assembly of claim 8, wherein the reflectance of the at least one anti-reflective layer at 700 nm is R700, and the following condition is satisfied:

0.0%<$R$700<0.6%.

10. The imaging lens assembly of claim 1, further comprising:
a first light blocking sheet, disposed between the first plastic lens element and the second plastic lens element, and having an opening;
wherein a diameter of the optical effective region of the image-side surface of the first plastic lens element is ID1, a diameter of the optical effective region of the object-side surface of the second plastic lens element is OD2, a diameter of the opening of the first light blocking sheet is SD1, and the following condition is satisfied:

ID1<SD1<OD2.

11. The imaging lens assembly of claim 10, further comprising:
a second light blocking sheet, disposed between the first plastic lens element and the second plastic lens element, and having an opening;
wherein the diameter of the optical effective region of the image-side surface of the first plastic lens element is ID1, the diameter of the optical effective region of the object-side surface of the second plastic lens element is OD2, a diameter of the opening of the second light blocking sheet is SD2, and the following condition is satisfied:

SD2<ID1<OD2.

12. An electronic device, comprising:
the imaging lens assembly of claim 1; and
an image sensor, corresponding to the imaging lens assembly.

* * * * *